US012757750B2

(12) United States Patent
Jin et al.

(10) Patent No.: US 12,757,750 B2
(45) Date of Patent: Oct. 6, 2026

(54) METAL PILLAR FOR CONDUCTIVE CONNECTION

(71) Applicant: DUKSAN HI METAL CO., LTD., Ulsan (KR)

(72) Inventors: Eun Dong Jin, Ulsan (KR); Lee Hyunkyu, Ulsan (KR); Kim Kyung Tae, Ulsan (KR); Bae Sung Moon, Ulsan (KR); Park Eun Kwang, Ulsan (KR); Seong Taek Kim, Ulsan (KR); Kim Jin-Gyu, Ulsan (KR); Chu Yongcheol, Ulsan (KR); Oh Heebong, Ulsan (KR)

(73) Assignee: DUKSAN HI METAL CO., LTD., Ulsan (KR)

( * ) Notice: Subject to any disclaimer, the term of this patent is extended or adjusted under 35 U.S.C. 154(b) by 421 days.

(21) Appl. No.: 18/456,905

(22) Filed: Aug. 28, 2023

(65) Prior Publication Data

US 2024/0088079 A1 Mar. 14, 2024

(30) Foreign Application Priority Data

Sep. 6, 2022 (KR) ........................ 10-2022-0112704

(51) Int. Cl.

| | |
|---|---|
| ***H10W 70/09*** | (2026.01) |
| ***H10W 70/05*** | (2026.01) |
| ***H10W 90/00*** | (2026.01) |
| *H10W 72/00* | (2026.01) |
| *H10W 72/20* | (2026.01) |

(52) U.S. Cl.

CPC ....... *H10W 70/093* (2026.01); *H10W 90/701* (2026.01); *H10W 72/01212* (2026.01); *H10W 72/221* (2026.01); *H10W 72/223* (2026.01); *H10W 72/252* (2026.01); *H10W 72/255* (2026.01); *H10W 90/724* (2026.01)

(58) Field of Classification Search

CPC ............. H10W 90/701; H10W 90/724; H10W 72/221; H10W 72/223; H10W 72/252; H10W 72/255; H10W 72/50; H10W 72/00; H10W 40/228

See application file for complete search history.

(56) References Cited

U.S. PATENT DOCUMENTS 3,951,497 A * 4/1976 Balzano ............... H01R 31/085 439/510
4,487,313 A * 12/1984 Repik ................... B29C 65/224 206/204
5,831,332 A * 11/1998 Sono ...................... H05K 3/303 257/773
2009/0315170 A1* 12/2009 Shim ....................... H10P 72/74 257/E21.705

(Continued)

FOREIGN PATENT DOCUMENTS

JP 2000232265 A * 8/2000 ............... H05K 3/34
KR 102216143 B1 * 2/2021 ......... G01R 1/06738
KR 102273299 B1 * 7/2021 ............ H10W 44/00

*Primary Examiner* — Ida M Soward

(74) *Attorney, Agent, or Firm* — Blueshift IP; Robert Plotkin

(57) ABSTRACT

An aspect of the present invention provides a metal pillar in a columnar shape formed by cutting a metal wire to a predetermined length. The metal pillar has a burr length of 0.1 to 0.5 μm on the cutting surface, an electrical conductivity of 11 to 101% IACS, and a Vickers hardness of 150 to 300 HV.

8 Claims, 8 Drawing Sheets

(56) References Cited

U.S. PATENT DOCUMENTS

| | | | | |
|---|---|---|---|---|
| 2010/0140638 | A1* | 6/2010 | Kotani | B29C 45/0001 257/E33.059 |
| 2011/0237065 | A1* | 9/2011 | Kawashiro | B23K 35/3612 438/615 |
| 2012/0068206 | A1* | 3/2012 | Ivanov | F21V 29/80 257/E33.065 |
| 2017/0022356 | A1* | 1/2017 | Yamazawa | C08G 59/24 |
| 2022/0099731 | A1* | 3/2022 | Liang | G01R 31/2855 |
| 2022/0238425 | A1* | 7/2022 | Hsu | H10W 70/614 |

* cited by examiner

| Embodiment 1 | Embodiment 2 | Embodiment 3 |
|---|---|---|
|  |  |  |
| Embodiment 4 | Embodiment 5 | |
|  |  | |
| Comparative Example 1 | Comparative Example 2 | Comparative Example 3 |
|  |  |  |

METAL PILLAR FOR CONDUCTIVE CONNECTION

CROSS-REFERENCE TO RELATED APPLICATIONS

This application claims priority to KR 10-2022-0112704 filed Sep. 6, 2022, entitled "METAL PILLAR FOR CONDUCTIVE CONNECTION", which is incorporated by reference in its entirety.

TECHNICAL FIELD

This invention relates to metal pillar for conductive connection, and more specifically, it is related to the electrically conductive metal pillars used for electrically connecting both ends.

FIELD AND BACKGROUND OF THE INVENTION

Traditional semiconductor packaging materials are requiring the development of new concepts of interconnection materials as the pitch distance between electrodes decreases. As a pillar-type interconnection material, stable connection methods are being researched using conductive connecting pillars plated with solder layers on metal pillars or electrically connecting metal pillars. When using metal pillars or connecting pillars, even with a narrow pitch distance, it is possible to use them without the risk of bridges. Since metal pillars or connecting pillars are made of metals with high thermal conductivity, they also have a heat dissipation effect by emitting heat generated in the semiconductor to the substrate.

However, since there has not been a specific study on the conventional metal pillars and their manufacturing methods, or conductive connecting pillars plated with solder layers on metal pillars and their manufacturing methods, or transfer methods or connection methods of connecting pillars, there is a need for development in these fields.

PRIOR ART LITERATURE

Patent Literature (Patent Literature 0001) Korean Published Patent No. 10-2007-0101157

SUMMARY OF THE INVENTION

Object of the Invention

One aspect of this invention provides a metal pillar and its manufacturing method with minimized burr occurrence when cutting metal wire.

Another aspect of this invention provides a method for manufacturing connecting pillars with excellent electrical and thermal conductivity and excellent connection reliability even at high aspect ratios.

Another aspect of this invention provides a method for manufacturing connecting pillars with excellent electrical and thermal conductivity and excellent connection reliability even at high aspect ratios.

Another aspect of this invention provides an efficient method for attaching connecting pillars and a connecting pillar transfer cradle that efficiently transfers connecting pillars.

Another aspect of this invention provides an electrical connection method for stable connection between electrodes inside a semiconductor package using externally transferred connecting pillars.

Another aspect of this invention aims to provide a dual solder layer connection post that solves the problem of tilted and missing connection posts.

Means to Solve the Invention

The electrical connecting metal pillar according to one aspect of the present invention is a column-shaped metal pillar formed by cutting a metal wire to a predetermined length, having an electrical conductivity of 11 to 101% IACS and a Vickers hardness of 150 to 300 HV.

Furthermore, the metal pillar is desirable that the diameter of the metal pillar is between 50 to 300 μm and the height is between 60 to 3,000 μm, and the aspect ratio (length/diameter) of the metal pillar is between 1.2 to 5.

Furthermore, the metal pillar may have a melting point of 500 to 1000° C., and the tensile strength of the metal pillar can be 170 to 950 MPa.

Furthermore, the metal pillar is mainly composed of one metal selected from the group consisting of Cu, Ag, Au, Pt, and Pd, and it is desirable to comprise one metal selected from the group consisting of Sn, Fe, Zn, Mn, Ni, and P in an amount of 0.1 wt. % to 20 wt. %. The thermal conductivity of the metal pillar can be 50 to 450 W/mK, and more preferably 320 to 450 W/mK.

A method for manufacturing an electrically conductive metal pillar according to one aspect of the present invention comprising the following steps:

(a) A melting process: a process of melting by including additive elements in the molten solution of base metal,
(b) A stranding process: a process of manufacturing a strand or slices by rolling, pressing, or drawing the melted solution in the melting process,
(c) A wire drawing process: a process of drawing the strand or slices into a wire,
(d) A heat treatment process: a process of heating the drawn wire at a temperature of 160 to 300° C., and
(e) A cutting process: a process of cutting the metal wire into a predetermined length to produce a metal pillar.

The electrical conductivity of the metal pillar should be in the range of 11 to 101% IACS, and the Vickers hardness should be between 150 and 300 HV.

Effects of the Invention

A metal pillar and its manufacturing method according to one aspect of the present invention can minimize burrs generated when cutting a metal wire.

Furthermore, according to another aspect of the present invention, the connecting pillar and the manufacturing method thereof have excellent electrical conductivity and thermal conductivity and exhibit excellent connection reliability even at high aspect ratios. Compared to traditional connection materials, the reduced volume of the solder layer in the connecting pillar increases its thermal conductivity, resulting in an effect of dissipating heat to the substrate.

Furthermore, according to another aspect of the present invention, the connecting pillar transfer cradle and the attachment method of the connecting pillar enable efficient transfer and attachment of the connecting pillar.

Furthermore, the transfer cradle and attachment method of the connecting pillar according to another aspect of the present invention have the effect of efficiently transferring and attaching the connecting pillar.

Another aspect of the present invention provides an electrical connection method that enables stable connection between electrodes inside a semiconductor package using externally transferred connecting pillars.

Furthermore, according to another aspect of the present invention, the dual solder layer connecting pillars provide stable connection reliability.

DETAILED DESCRIPTION OF THE INVENTION

Figure 1:
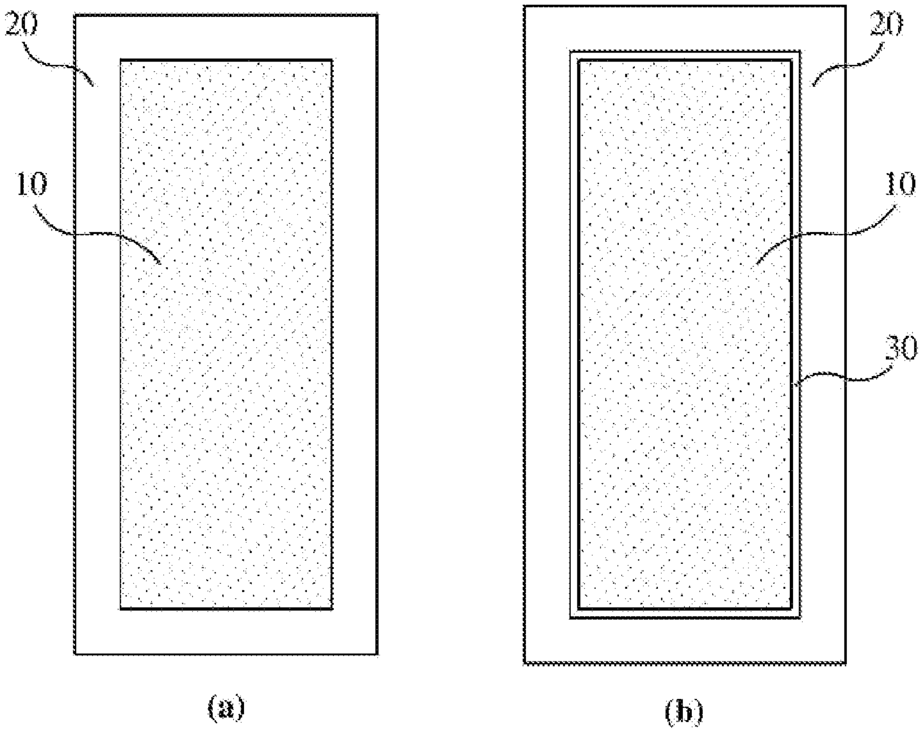
FIG. 1 is a cross sectional view of connecting pillar.

Prior to describing the present disclosure in detail hereinbelow, it should be understood that the terms used in the present specification are solely for the purpose of describing specific embodiments, and not to limit the scope of the present disclosure that is limited only by the scope of the claims attached hereto. This should be understood to comprise all transformations, equivalents, or substitutes that fall within the scope of the inventive concept or technical concept.

The terms used herein are merely for the purpose of describing a particular embodiment and are not intended to limit the scope of the inventive concept. Unless the context explicitly indicates otherwise, singular terms comprise the plural and vice versa. In the following, terms such as "comprises" or "has" are intended to indicate the presence of features, numbers, steps, operations, components, parts, elements, materials, or combinations thereof disclosed in the specification, and are not intended to exclude the presence or possibility of one or more other features, numbers, steps, operations, components, parts, elements, materials, or combinations thereof.

To clearly illustrate multiple layers and areas in the drawing, the thickness has been magnified or reduced. Similar parts throughout the specification are indicated by the same reference numerals. Throughout the specification, when a component such as a layer, film, area, or plate is described as being "on" or "above" another component, this comprises cases where there is another component in between. Conversely, when a component is described as "directly above" or "on top of" another part, it means that there is no other part in between. In addition, in describing the components of the present invention, terms such as "first," "second," "A," "B," "(a)," "(b)," and the like may be used. Such terms are used merely to distinguish one component from another and do not limit the essence, order, or sequence of the component in any way. The terms are used for the sole purpose of distinguishing one component from another component.

Although terms such as "first," "second," etc. may be used to describe various elements, components, regions, layers, and/or areas, such elements, components, regions, layers, and/or areas are not limited by such terms.

Furthermore, it should be understood that the processes described in the present invention are not necessarily applied sequentially. For example, if steps 1 and 2 are disclosed, it should be understood that step 1 may not necessarily be performed before step 2.

In this specification, the term "metal" may be used in a comprehensive sense that generally refers to metals, comprising metal alloys and other metal-related materials, in addition to metal elements.

<The First Aspect>

The typical manufacturing process of a metal pillar from a metal wire involves melting the metal, supplying it to a continuous casting device, and solidifying it in the continuous casting device to form a strand. Then, the metal strand is formed (by, for example, rolling, pressing, or drawing) into a copper wire with a specified diameter, depending on the application.

Typically, copper wire requires high electrical conductivity, so it is necessary to provide high-purity molten copper by removing additives as much as possible.

A method of reducing the content of additive elements in a molten copper is to set an appropriate amount of oxygen in the molten copper and solidify the additive elements present in the melt. This causes the oxide of the additive element formed to float on the surface of the molten copper as slag, enabling it to be removed.

However, copper wire produced from high-purity molten copper has a problem of burr formation on the cut surface when the wire is cut, as the purity of the material increases, and the crystal size increases accordingly. Burr can be defined as an incomplete finish where some copper remains in the direction of the cut when the wire is cut with a knife or the like. When cutting copper wire with burrs, if the wire is used to make connecting pillars for semiconductor packages, the problem of difficulty in properly aligning the connecting pillars arises due to the burrs.

The first aspect of the present invention provides a metal pillar and a method for manufacturing the metal pillar. In the present invention, the metal pillar is a cylindrical metal pillar manufactured by cutting a metal wire to a certain diameter and height.

In the embodiments of the present invention, the metal pillar 10 is a column-shaped metal pillar manufactured by cutting a metal wire to a certain diameter and height. Referring to FIG. 1(*a*), a connecting pillar according to the present invention comprises the metal pillar 10 and a solder layer 20 disposed on an outer surface of the metal pillar 10. As shown in FIG. 1(*b*), the connecting pillar may further comprise a diffusion layer 30 disposed between the metal pillar 10 and the solder layer 20. The metal pillar 10 is used as a connecting metal pillar for electrically connecting the substrate and the pads or electrodes on the substrate and semiconductor chips. The metal pillar 10 for conductive connection needs to be high, with a conductivity of 11 to 101% IACS.

To achieve the electrical conductivity, the metal pillar for conductive connection comprises at least one metal selected from the group consisting of Cu, Ag, Au, Pt, and Pd as the main component, which provides high electrical conductivity ranging from 11 to 101% IACS.

In addition, when the metal pillar for conductive connection according to this embodiment is used as a connecting material, it is desirable to have a thermal conductivity of 50 to 450 W/mK, and more preferably 320 to 450 W/mK. In this case, the connecting material can have a heat dissipation effect that transfers heat to the substrate.

In addition, it is desirable for the metal pillar according to this embodiment to have a Vickers hardness of 160 to 300 HV. If the range is exceeded, there may be problems with cutting during pillar fabrication, such as breakage or bending, and if it is below the range, there may be problems with burr formation on the cut surface.

Furthermore, in the present embodiment, since the metal pillar is created by cutting the metal wire, burrs may inevitably occur on the cut surface. In this case, it is desirable that the length of the burr be 0.1 to 0.5 μm.

If the burr on the metal pillar generated during the cutting of the metal wire is larger than a certain size, it is difficult to plate the solder layer, and in semiconductor packages where the pillars must be used standing up, they cannot perform their function as connecting pillars. Therefore, by using a metal pillar with a burr within the range, it is possible to manufacture a metal pillar with excellent plating adhesion and prevention of tilting due to uniformization and minimization of plating thickness.

The diameter of the metal pillar is 50 to 300 μm, preferably 100 to 200 μm, and the height is 60 to 3,000 μm, preferably 150 to 500 μm. The aspect ratio (length/diameter) is 1.1 to 15, and preferably 1.5 to 5. In the present invention, since the metal pillars are manufactured by cutting the metal wire, it is possible to manufacture metal pillars with an aspect ratio of 3 to 5, which can be applied to multi-chip packages with narrow pitch spacing and high substrate-to-substrate heights.

It is desirable for the metal pillar to have a melting point of 500 to 1000° C. If the melting point exceeds this range, the manufacturing cost increases, and if it is below this range, there may be a problem of melting during the bonding process.

The tensile strength of the metal pillar should be within the range of 170 to 950 MPa. If the range is exceeded, it can cause problems with the supply of the metal material, and if it is below the range, there can be issues with the deformation of the pillar during manufacturing.

As one embodiment of a metal pillar, a copper alloy pillar can be manufactured. The copper alloy pillar is a columnar structure manufactured by cutting a copper alloy wire with a certain diameter and height and comprises copper and at least one additive element.

High purity copper pillars with a purity of 99.9% or higher have a very high electrical conductivity of 99 to 101% IACS. However, when copper pillars are made only from high purity copper, they tend to have high ductility, which can cause burrs to form on the cut surface when the wire is cut. To solve this problem, additive elements are added.

In other words, by comprising a certain amount of additive element in copper, it is possible to reduce the size of the crystalline structure with respect to mechanical properties when the copper melt is hardened. Therefore, copper alloy wire manufactured by comprising the additive element can minimize the number of burrs on the cut surface as the strength and hardness of the material increase, making the surface of the material harder.

It is desirable for the additive element to be at least one selected from the group consisting of Sn, Fe, Zn, Mn, Ni, and P, and to be comprised in a range of 0.1 wt. % to 20 wt. %, and more preferably, 5 wt. % to 10 wt. %. If the amount of the additive element is below the above range, excessive burrs may occur on the cut surface, while exceeding the above range can result in poor electrical conductivity.

More preferably, the additive element comprises Sn in a range of about 0.05 to 20 wt. % (more preferably 2 to 10 wt. %), and Sn and Zn can be mixed at a ratio of 1:1 to 100:1 (preferably 1:1 to 10:1) before adding it. Since Sn has an effect of increasing strength and hardness, and Zn has an effect of increasing corrosion and wear resistance, they can minimize the amount of burr in the combination of the above range, making them the most desirable choices. Furthermore, to improve corrosion resistance and reliability, additional elements such as P can be comprised at 0.01 to 1 wt. % and Pt or Pd at 0.01 to 10 wt. %.

The Vickers hardness of the metal pillar having the composition of this embodiment has a high hardness of at least 150 HV and can be desirably within the range of 150 to 300 HV, and more desirably within the range of 160 to 220 HV. To achieve the above Vickers hardness, it is desirable to carry out the heat treatment as described below.

The manufacturing process of a metal pillar is described below. The manufacturing process of the metal pillar comprises a melting process, a strand process, a wire drawing process, a heat treatment process, and a cutting process.

The melting process is a step of melting a metal solution with a specific composition of additive elements comprised.

The stranding process is a step of manufacturing a metal pillar by forming the molten alloy into strands or slices through rolling, pressing, or drawing.

The wire drawing process is a step of drawing the strand or slices into a wire with a specific diameter in the wire drawing process.

The heat treatment process is a step of heat treatment to secure the strength according to the composition.

Furthermore, the heat treatment process is a step of treating the material at a temperature between 160° C. and 300° C. to secure the strength according to the composition. By heat treatment, the Vickers hardness can be achieved within the desired range of 150 to 300 HV. If the hardness exceeds this range, it may become too hard to cut or even break, and if the hardness is lower than this range, the size and number of burrs may increase.

After the heat treatment process, the metal pillars were subjected to an acid treatment by immersion in an acid. This was done to remove the oxide layer formed on the surface of the metal pillars due to the annealing process.

The cutting process is a step of cutting the heat-treated metal wire to a specified length. Currently, it is desirable to use a die-cutting method for cutting, when cutting the heat-treated metal wire to a specific length. The die-cutting method uses a pressing process, where the metal wire is inserted into the die inside the press at regular intervals, and then cut at high speed to produce metal pillars. Drawing a metal wire with the composition as described above, when cutting using the die cutting method, it is possible to minimize burr formation and produce economically while cutting the metal wire with the same composition as described above, with the metal wire having a Vickers hardness of 150 to 300 HV after heat treatment.

The metal pillar is a connecting material that electrically connects the chip and the substrate and can be used by covering the outer layer with a solder layer, as will be described later. In addition, solder paste, or the like can be applied by printing on the electrodes of the chip and substrate, allowing it to be used as a self-connecting material without forming a solder layer on the external surface.

<The Second Aspect>

The second aspect of the present invention is the connecting pillar and its manufacturing method. FIG. 1 is a cross sectional view of connecting pillar. Thus, the connecting pillar according to the present invention comprises a metal pillar and a solder layer.

In this case, the metal pillar used is the same as the metal pillar described in the first aspect, with a burr length of 0.1 to 0.5 μm, electrical conductivity of 11 to 101% IACS, and Vickers hardness of 150 to 300 HV. It also has a thermal conductivity of 50 to 450 W/mK, and more preferably 320 to 450 W/mK. Since the detailed description of the metal pillar has been provided in the first aspect, a detailed explanation is omitted for the clarity of the invention. It is desirable for the metal pillar to have high thermal and electrical conductivity.

The solder layer is provided in at least one region on the outer surface of the metal pillar. The solder layer is formed to connect the top and bottom of the substrate or chip of the connecting pillar to each other as it is melted.

The solder layer is plated on the metal pillar, so the plating property of the metal pillar must be good. Additionally, since the contact area between the connecting pillar and the substrate is smaller than that of the solder ball, a phenomenon called 'Missing' can occur in large quantities during the reflow process of attaching the solder layer to the printed circuit board, where the connecting pillar fails to stick to the electrode or substrate, resulting in significantly reduced workability. Therefore, it is necessary to enhance the reliability of the connecting pillar by satisfying both the heat shock performance and acceleration shock performance of the solder joint.

On one hand, in one embodiment of the present invention, the solder layer is composed of tin (Sn), an element with excellent properties of electrical conductivity, ductility, corrosion resistance, and castability, which has similar physical characteristics to lead (Pb) but is used instead of lead due to regulations on environmental pollution prohibiting the use of lead.

However, to meet the required properties of the solder layer such as plating ability, drop strength, thermal cycling (TC) characteristics, and wettability, it is desirable to use other metals alloyed with tin rather than forming the solder layer with tin alone.

The solder layer of the present invention is preferably made using a Sn—Ag—Cu alloy in which silver (Ag) and copper (Cu) are alloyed with tin (Sn) to achieve high electrical and thermal conductivity. This alloy, comprising residual tin and unavoidable impurities, adheres well to copper alloy pillars before reflowing, and can ensure connection reliability after reflowing.

More specifically, the solder alloy is composed of 1.5 to 4.0 wt. % of silver (Ag), 0.2 to 2.0 wt. % of copper (Cu), residual tin (Sn), and inevitable impurities. By using this solder alloy, solder pillars can be manufactured with excellent drop strength, thermal cycling (TC) characteristics, wettability, and low missing rate.

When examining each component element of the solder layer, Silver (Ag) is non-toxic and improves the melting point of the alloy, as well as the wettability of the joint material. It also reduces electrical resistance and enhances thermal cycling (TC) characteristics and corrosion resistance.

The optimal content of silver (Ag) in the solder layer is between 1.5 to 4.0 wt. %. When the content of Ag is less than 1.5 wt. %, it is difficult to ensure sufficient electrical conductivity and thermal conductivity of the solder layer, and the wettability is reduced. On one hand, when the Ag content exceeds 4.0 wt. %, a bulky IMC called Ag3Sn is formed inside the solder alloy and solder layer, which leads to overgrowth of the bulky IMC and hinders the drop impact resistance of the solder. An ideal range for the content of silver (Ag) in the solder layer is 2.2 to 3.2 wt. %, and even more ideally, 3.0 wt. %.

Copper (Cu) affects the joint strength or tensile strength and improves the drop strength characteristics. A desirable range for the content of copper (Cu) in the solder layer is between 0.2 to 2.0 wt. %, and if the copper content is below 0.2 wt. %, it is difficult to improve the desired joint strength or tensile strength of the solder layer, while exceeding 2.0 wt. % can make the solder layer brittle and prone to tissue damage, leading to decreased workability. Ideally, a content range between 0.2 to 1.0 wt. % is desirable, and even more preferably, a content of 0.5 wt. % is desirable.

Optionally, zinc can be additionally comprised. When zinc (Zn) is comprised in the range of 0.1 to 0.7%, it can prevent the formation of Bulky IMC and improve the wettability.

It is desirable for the solder layer to be formed with a thickness of 1/300 to 1/3 of the diameter of the metal pillar. If it exceeds 1/3, there may be a problem of tilting during bonding, and if it is less than 1/300, there may be a problem of insufficient solder leading to poor bonding.

The melting point of the solder layer is preferably between 200 and 250° C. If the temperature exceeds 250° C., it may cause damage to the electronic product, and if it is below 200° C., there may be a problem of re-melting during product use.

Figure 2:
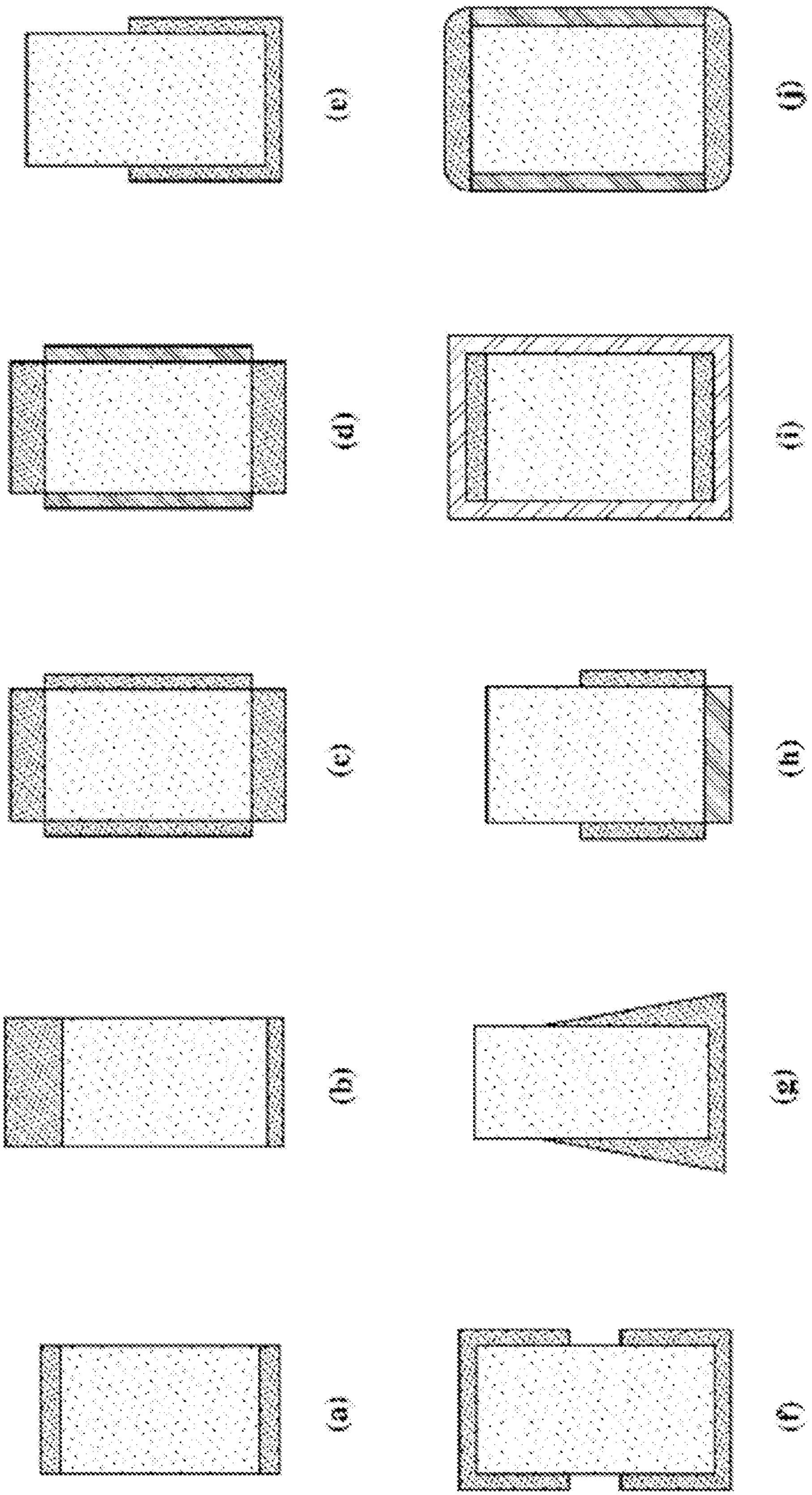
FIG. 2 is a schematic diagram showing various shapes of connecting pillars according to various aspects of the present invention.

The solder layer is formed in at least one area of the metal pillar, and its shape is not limited. FIG. 2 is a schematic diagram showing various shapes of connecting pillars according to various aspects of the present invention. According to FIG. 2, the connecting pillars may have solder layers formed only on the sides depending on the application, or on both upper and lower sides, or along the sides of the upper and lower parts, demonstrating the flexibility of the shape of the solder layer. The thermal conductivity of the solder layer is desirable to be in the range of 50 to 80 W/mK. In addition, although the diffusion layer is not shown in FIG. 2, it can be provided as will be described later.

On one hand, it is desirable to have a diffusion layer between the metal pillar and the solder layer. The intermetallic layer, which is introduced to prevent the formation of intermetallic compounds between the metal alloy atoms contained in the metal pillar and the tin or other metal atoms in the solder layer, is desirable. The diffusion layer comprises a region in which metal atoms contained in the metal column diffuse at high temperatures to form a solid solution. As a desirable example, when using copper as the first metal, diffusion layer is preferable to comprise nickel, which has a similar or identical crystal structure and a small difference in atomic size. For example, nickel (Ni), Ni—Ag, Ni—P, Ni—B, Co, etc. can be used.

To increase the electrical and thermal conductivity of the connecting pillar, it is desirable to form the plating layer of the diffusion layer with a thermal conductivity of 50-100 W/mK, and in this case, Ni—Ag is a desirable material to be used.

The following describes the method of manufacturing a connecting pillar according to the present invention. The method of manufacturing a connecting pillar comprises a melting process, a stranding process, a cutting process, and a solder layer forming process.

The melting process is a step of melting a metal solution with a specific composition of additive elements comprised.

The stranding process is a step of manufacturing a metal pillar by forming the molten alloy into strands or slices through rolling, pressing, or drawing.

The wire drawing process is a step of drawing the strand or slices into a wire with a specific diameter in the wire drawing process.

The heat treatment process is a step of heat treatment to secure the strength according to the composition.

Furthermore, the heat treatment process is a step of treating the material at a temperature between 160° C. and 300° C. to secure the strength according to the composition. By heat treatment, the Vickers hardness can be achieved within the desired range of 150 to 300 HV. If the hardness exceeds this range, it may become too hard to cut or even break, and if the hardness is lower than this range, the size and number of burrs may increase.

The cutting process is a step of cutting the heat-treated metal wire to a specified length. Currently, it is desirable to use a die-cutting method for cutting, when cutting the heat-treated metal wire to a specific length. The die cutting method uses a pressing process, where the metal wire is inserted into the die inside the press at regular intervals, and then cut at high speed to produce metal pillars. Drawing a metal wire with the composition as described above, when cutting using the die cutting method, it is possible to minimize burr formation and produce economically while cutting the metal wire with the same composition as described above, with the metal wire having a Vickers hardness of 150 to 300 HV after heat treatment.

The solder layer forming process is a step of forming a plating layer by electrolyzing a metal comprising Sn onto the surface of the metal core. In the plating of the solder layer, a plating step is performed by passing a metal containing Sn onto the surface of the metal core to form a plating layer. The plating is carried out by placing the metal core in a barrel, applying the metal to be plated as the anode, and suspending the plating solution in the barrel to act as the cathode. At this time, the temperature is maintained at 20-30° C. Plating is carried out for an appropriate time depending on the size.

The material for the solder plating amount can be an alloy containing Sn, such as SnAg, SnAgCu, SnCu, SnZn, SnMg, SnAl.

Sn—Ag—Cu alloy can be preferably used, and the copper (Cu) content is 0.2 to 2.0 wt. %.

If copper (Cu) content is less than 0.2 wt. %, it is difficult to improve the joint strength or tensile strength of the solder layer as desired. If copper (Cu) content is exceeding 2.0 wt. %, the solder can harden and cause tissue damage easily, and can reduce workability. Preferably, it is desirable to have a copper (Cu) content of 0.2 to 1.0 wt. %, and more preferably 0.5 wt. %. Also, the desirable range for Ag content is 1.5 to 4.0 wt. %.

If the silver (Ag) content is less than 1.5 wt. %, it is difficult to ensure sufficient electrical and thermal conductivity of the solder layer and the wettability is deteriorated. If the silver content exceeds 4.0 wt. %, bulky IMC (intermetallic compound) called Ag3Sn is formed inside the solder alloy and solder layer, which can lead to overgrowth of the bulky IMC and impair the impact resistance properties of the solder. The electrolyte used for plating is preferably a solution of methane sulfonic acid.

On one hand, the manufacturing process of the connecting pillars according to the present invention may further comprise pre-treatment and diffusion layer formation processes before the solder layer formation process.

The pre-treatment process comprises a degreasing process to remove organic or contaminant substances on the surface of the metal pillar and an acid etching process to remove oxide layers on the surface of the metal pillar. If organic or contaminant substances, or oxide layers exist on the surface of the metal pillar, it is necessary to perform a pre-treatment process because the formation of the plating layer may not proceed smoothly.

The diffusion layer formation processes after the pre-treatment process can prevent oxidation and wettability issues on the copper pad and metal pillar surfaces, and induce the formation of (Cu,Ni)6Sn5 intermetallic compounds instead of Cu6Sn5, which can improve the bonding strength and increase the reliability of the solder layer.

The composition of the diffusion layer formed on the surface of the connecting pillars is not limited, but it can be made of materials such as nickel (Ni), Ni—Ag, Ni—P, Ni—B, and Co. Among them, Ni—Ag is desirable considering its thermal conductivity. The diffusion layer can generally be formed by a well-known electroplating method. If the diffusion layer is formed by electroless plating, there may be issues with thickness control and reliability.

The thickness of the solder layer depends on the diameter of the metal pillar, with a range of 1 to 10 μm, and preferably 1 to 7 μm, more preferably 1 to 5 μm, or most preferably 1 to 3 μm. If the thickness of the solder layer exceeds the above range, there is a problem of bridging due to tilting or excessive solder amount during bonding, and the thermal conductivity deteriorates. If the thickness is below the above range, there is a problem of insufficient solder leading to poor bonding.

The thickness of the diffusion layer is preferably 0 to 5 μm. In other words, the diffusion layer can be optionally comprised, but it is desirable to comprise it. When the diffusion layer is comprised, it is desirable for its thickness to be within 0 to 5 μm. The diffusion layer can be formed by electroplating within the range of 1 to 5 μm or 1 to 3 μm, and it is desirable for the thickness of the diffusion layer to be smaller than that of the solder layer. If the thickness is outside the above range, there is a risk of initial crack formation due to the Kirkendall voids generated by thermal sources (comprising 150° C. ambient temperature) in the joint layer between the copper pad, metal pillar, and solder. In addition, Cu consumption may occur during long-term heat treatment or exposure to thermal cycling/thermal shock.

Furthermore, the thermal conductivity of the metal column should be in the range of 50 to 450 W/mK, preferably 320 to 450 W/mK. The thermal conductivity of the solder layer should be in the range of 50-80 W/mK, and the thermal conductivity of the diffusion layer should be in the range of 50-100 W/mK. Since the contact pillars have a small heat transfer area and a long heat transfer thickness, it is desirable to keep the thickness of the low thermal conductivity solder layer as thin as possible to maintain a high overall thermal conductivity of the contact pillars.

<The Third Aspect> The Connecting Pillar Transfer Cradle

Figure 3:
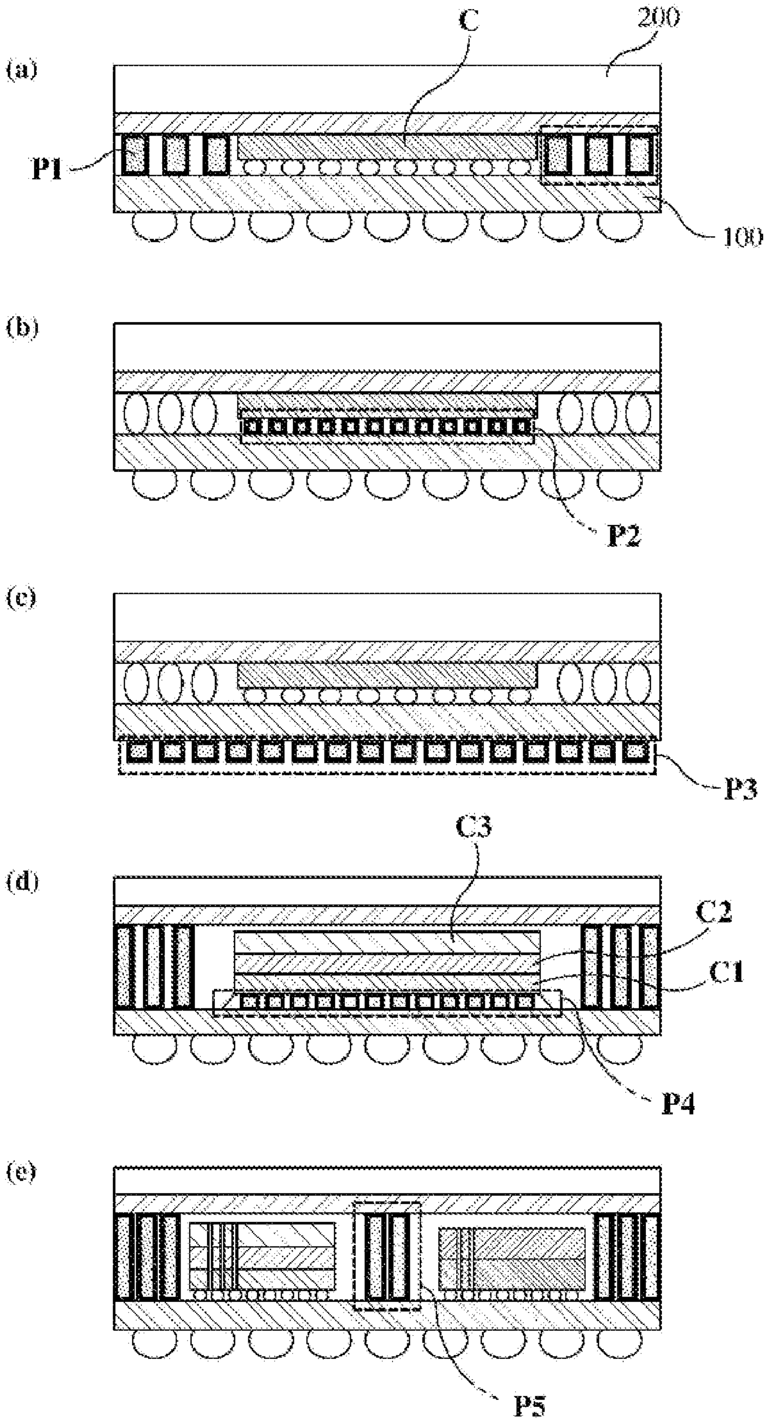
FIG. 3 is following: (a) illustrates an embodiment of a connecting pillar used for joining an upper substrate and a lower substrate, (b) illustrates an embodiment of a connecting pillar used for joining a chip and a lower substrate, (c) illustrates an embodiment of a connecting pillar used for joining a lower substrate and a PCB, (d) illustrates a connecting pillar used for connecting an upper substrate and a lower substrate in a large-scale server-oriented multi-chip package, and (e) illustrates a connecting pillar used for connecting an upper substrate and a lower substrate in a mobile-oriented multi-chip package.

The connecting pillar according to the present invention can be applied to various uses of semiconductor packages. FIG. 3 is following: (a) illustrates an embodiment of a connecting pillar used for joining an upper substrate and a lower substrate, (b) illustrates an embodiment of a connecting pillar used for joining a chip and a lower substrate, (c) illustrates an embodiment of a connecting pillar used for joining a lower substrate and a PCB, (d) illustrates a connecting pillar used for connecting an upper substrate and a lower substrate in a large-scale server-oriented multi-chip package, and (e) illustrates a connecting pillar used for connecting an upper substrate and a lower substrate in a mobile-oriented multi-chip package.

In other words, the connecting pillars according to the present invention can be used as an electrical connecting material, replacing conventional solder balls or solder bump, and can also be used as large aspect ratio connecting pillars that can connect long distances between the first substrate and the second substrate in a multi-chip package as shown in FIG. 3*d* and FIG. 3*e* where solder balls cannot be implemented.

The various types of connecting pillars according to the present invention are not formed by being stacked on the substrate during the packaging process but are manufactured externally and then transferred. "Therefore, the column-shaped pillars produced must be transferred during the packaging process and installed in the correct position.

Figure 4:
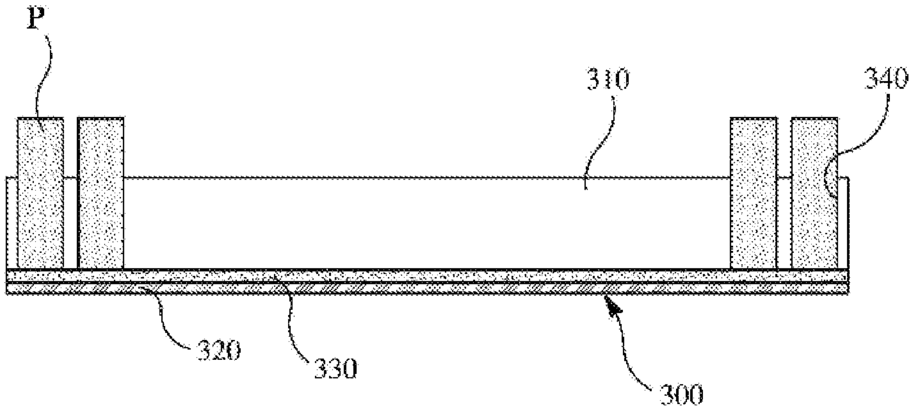
FIG. 4 is cross-sectional view of a connecting pillar transfer cradle.

To transfer the metal pillars, the present invention provides a connecting pillar transfer cradle on the third aspect. FIG. 4 is cross-sectional view of a connecting pillar transfer cradle. As shown in FIG. 4, the pillar transfer cradle of the present invention comprises connecting pillars, a transfer board, and a joining sheet.

The connecting pillar is a columnar shape with a solder layer on the outer surface of the metal pillar according to the second aspect of the present invention, and the connecting pillar is inserted into and aligned on the transfer board where through-holes are formed. In particular, the connecting pillars of the present invention are preferably used with an aspect ratio of 3 to 10.

The transfer board is a board with aligned through-holes designed to be in the position where the connecting pillars should be located on the package, and the transfer board has a certain thickness to allow the connecting pillars to be inserted into the through-holes and aligned. For example, for the connecting pillar to be stably inserted, it is desirable for the thickness of the transfer board to be at least ½ or more of the length of the connecting pillar.

The transfer board should be made of materials with low thermal expansion coefficients to minimize deformation due to heat during reflow of the connecting pillars. Suitable materials for the transfer board comprise aluminum, stainless steel, silicon carbide, titanium, and tungsten.

The joining sheet is a layer that the end of the connecting pillar joins, and it is desirable to select a heat-resistant material that does not burn during reflow of the connecting pillar. The joining sheet is located on the opposite side of the direction in which the connecting pillar is inserted, and when the connecting pillar is inserted, it is fixed by a bond adhesive layer or a tack adhesive layer. The joining sheet can be made of films of resins such as polyimide resin or polyester resin, for example.

The material of the bond adhesive layer is not limited to those that can adhere to the connecting pillars. For example, plastic adhesive, liquid epoxy, or EMC (Epoxy molding compound) can be used.

When using a tack adhesive layer, it is more environmentally friendly to replace only the tack adhesive layer, so the tack adhesive layer is more desirable. The material for the tack adhesive layer can be an acrylic adhesive solution or a silicone adhesive solution with strong heat resistance. This is because, as will be described later, heat resistance must be ensured during reflow of the connecting pillars.

In this case, to increase the adhesive area, it is desirable for the tack adhesive layer to be made of a soft material. In other words, in cases where only the end of the elongated pillar comes into contact, there is a risk of insufficient adhesion and detachment, so the pillar should be embedded in a soft tack adhesive layer to expand the adhesive area.

The tack adhesive layer may comprise two layers of adhesive, namely a first tack adhesive layer on the joining sheet side and a second tack adhesive layer on the upper side of the first tack adhesive layer. The first tack adhesive layer is a harder adhesive, and the second tack adhesive layer is a softer adhesive. The second tack adhesive layer may be made by comprising a rosin compound in the acrylic-based or silicon-based adhesive.

If the adhesive strength of the tack adhesive layer is weakened, the cradle of the connecting pillars can be reused by removing the joining sheet from the transfer board and attaching a new joining sheet to the transfer board.

Figure 5:
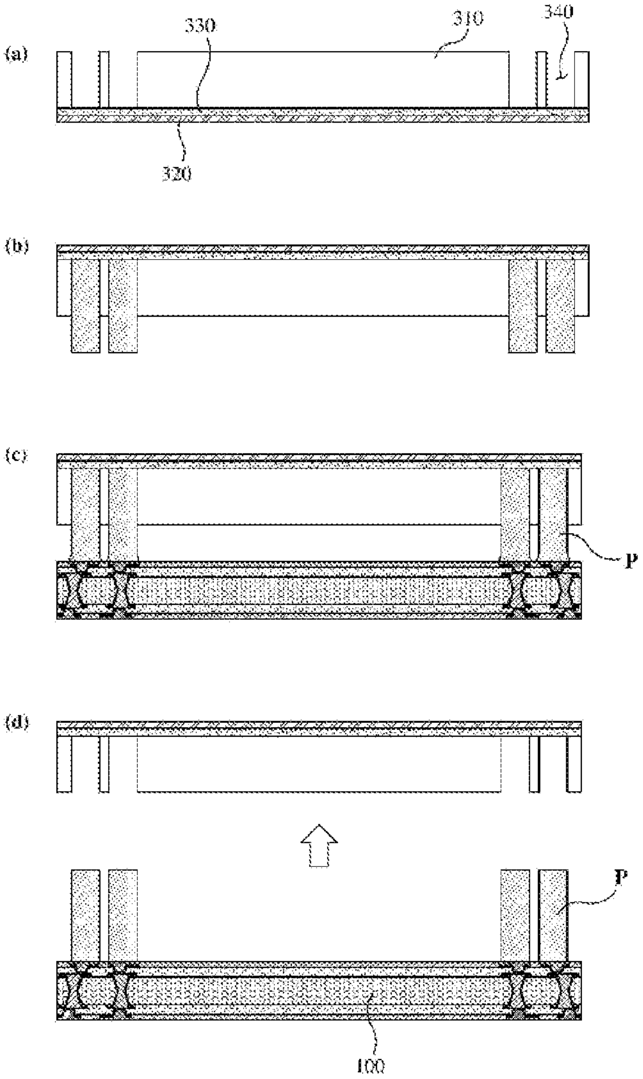
FIG. 5 is a process diagram of transferring the connecting pillars using the connecting pillar transfer cradle and connecting them between the substrates using the cradle.

FIG. 5 is a process diagram of transferring the connecting pillars using the connecting pillar transfer cradle and connecting them between the substrates using the cradle. According to FIG. 5, the joining process comprises an inserting stage of the connecting pillar, a transfer stage, and a connecting stage.

The inserting step is a process of inserting connecting pillars into the through-holes of the transfer cradle. As a result, a transfer cradle with attached connecting pillars is implemented, and insertion can be carried out in various ways, and a dedicated jig can be used for this purpose. The inserted connecting pillars are adhered by the bond adhesive layer or the tack adhesive layer of the joining sheet on the lower surface and maintains an adhesion that does not come off even when turned over and can be stored and transferred as a connecting pillar transfer cradle.

The transfer stage is the process of flippillarg the connecting pillar transfer cradle and transferring the connecting pillars onto the electrodes or pads of the board to align them in the predetermined position. The pillar transfer cradle connects each connecting pillar to the exposed corresponding electrode or pad on the lower board.

The connecting stage is a process of reflowing the solder layer of the connecting pillar and attaching it to the electrode or pad on the substrate. At this time, the joining sheet and transfer substrate must be made of heat-resistant materials and remain unchanged so that they can be removed even after reflowing.

The sheet removal stage is a step of removing the joining sheet. At this time, the adhesive force of the joining sheet is weaker than the bonding force that is soldered and attached to the pad, so it can be removed.

By using the connecting pillar transfer cradle according to this aspect, connecting pillars can be transferred from outside and connected to the substrate and/or semiconductor chip, without wet etching or other wet processes, making the process much simpler.

<The Fourth Aspect>

The fourth aspect of the present invention provides an electrical connection method using connecting pillars. Connecting pillars comprise a metal pillar and a solder layer provided on the outer surface of the metal pillar. Connecting pillars are formed by cutting metal wires and plating them with a solder layer, as described above.

The manufactured connecting pillar is initially bonded to the electrode or pad of the first substrate, and the other end is bonded to the electrode or pad of the second substrate to electrically connect them, or it is bonded to the semiconductor chip on one end and to the electrode or pad of the first substrate on the other end for electrical connection. At this time, the bonding is achieved by melting the solder paste, flux, and the solder layer provided on the outer surface and/or the lower surface of the connecting pillar.

Solder paste for connecting posts may be used in semiconductor packages, particularly to connect the ends of metal posts to electrodes or substrates in semiconductor packages, or to form a solder layer on the outer surface of the metal posts.

The flux prevents oxidation by reacting with oxygen in the air to which the solder and the component come into contact during the soldering process, so that when the solder powder melts, the flux melts with it, thereby forming a clean and reliable electrical connection between the solder and the component. Flux also cleans the component surface, removing impurities, oils, and other external contaminants, and improves the "wettability" of the solder so that it adheres to the component surface.

Typically, the connecting pillar is attached to the first substrate by melting the solder layer on the side of the metal pillar facing the first substrate and then standing up the metal pillar, followed by melting the solder layer on the side facing the second substrate and attaching it to the second substrate, thereby electrically connecting the first substrate and the second substrate.

The solder layer of the connecting pillar is melted in a random shape, not in a uniform shape, causing the problem of different heights of the connecting pillars.

Furthermore, when heat is applied to attach the other end of the connecting pillar to the second substrate, there is a problem where the connecting pillar may collapse or tilt as it melts all the way to the first substrate.

Therefore, this aspect provides a method for stably connecting the first substrate and the second substrate, or the substrate and the semiconductor chip with the connecting pillar.

Figure 6:
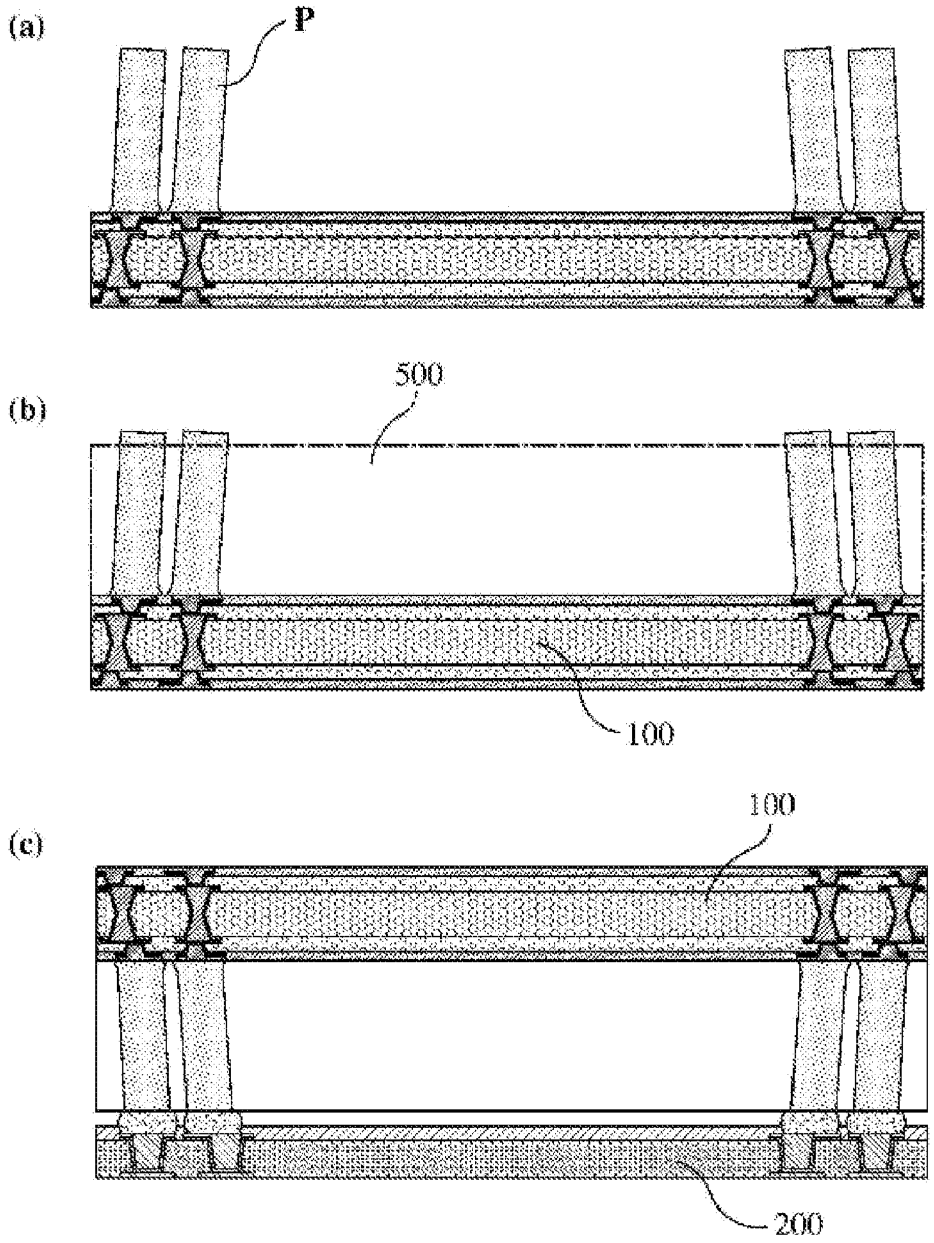
FIG. 6 is a process diagram of connecting the first substrate and second substrate using connecting pillars.

FIG. 6 is a process diagram of connecting the first substrate and second substrate using connecting pillars.

In FIG. 6, the connecting pillar is exaggeratedly tilted for convenience of description. Accordingly, the connecting step is an electrical connection method that electrically connects the electrodes or pads of the first substrate and the electrodes or pads of the second substrate, and comprises a first-end connecting stage in which the first end of the connecting pillar is attached to at least one area on the outer surface of a copper alloy pillar comprising copper on the electrode or pad of the first substrate, a resin coating stage in which a polymer resin is coated around the connecting pillar attached to the first substrate to form a resin cap exposed to the height of the other end of the connecting pillar, and a second-end connecting stage in which the solder layer on the other end of the connecting pillar is melted and attached to the second substrate after flippillarg the first substrate.

Firstly, the first-end connecting stage is a step where the solder layer of the connecting pillar is melted and attached to the first substrate. The connecting pillar is equipped with the solder layer on its entire outer surface or on both the top and bottom surfaces. Using the mentioned cradle is a preferable method to attach the connecting pillar to the solder layer. Flux, solder powder, or solder paste can also be applied first to the pads or electrodes of the first substrate before the solder layer is melted and attached. The flux, solder powder, or solder paste used in this case can be composed of various materials and formulations depending on the purpose and is not limited to any specific composition.

The resin coating stage involves applying a resin composition around the connecting pillar on the first substrate and allowing it to cure. Through curing, the connecting pillar becomes fixed and unable to move, thus preventing the problem of connecting pillar collapse. In this case, it is important to form the resin coating layer lower than the height of the pillar to ensure that the end of the connecting pillar is exposed. The desirable height for the exposed end of the connecting pillar typically ranges from 3 to 100 μm, depending on the height of the pillar. In this case, epoxy-based or silicone-based resins can be used as the resin composition.

The exposed end of the connecting pillar allows it to contact the second substrate when the solder layer on the outer surface melts, and it facilitates easy positioning verification with the exposed end of the connecting pillar. Furthermore, since the connecting pillar is secured by the resin layer on the first substrate, even if the end is tilted, it does not cause any issues with the connection.

Subsequently, the second-end connecting stage is the step where the solder layer on the tip of the connecting pillar is melted to attach it to the second substrate. The first substrate, in an inverted state with the connecting pillars encapsulated by the resin layer, is attached to the second substrate. In this process, the second substrate is provided with solder paste or flux applied on its pads or electrodes. Even if there is a slight variation in the protrusion height of the connecting pillars, it does not pose a problem for the connection due to the presence of flux, solder powder, solder paste, or similar materials applied to the pads or electrodes of the second substrate. Thus, the connection between the first substrate and the second substrate can be achieved using connecting pillars with solder layers, facilitating the connection process.

In this case, the connecting pillar's first end is connected to the first substrate's electrode or pad, while the connecting pillar's second end is connected to the second substrate's electrode or pad. The solder composition of the solder layer on the first and second ends of the connecting pillar can be the same or different. However, it is desirable to use the solder compositions described in FIG. 2 (*a*), (*b*), (*f*), and other variations of connecting pillars from the second aspect of the present invention or the dual layer connecting pillar from the fifth aspect of the present invention may be used depending on the situation.

In this embodiment, it is desirable for the connecting pillar to have a solder layer at the tip of the connecting pillar's second end, which connects to the second substrate. This is because the exposed end of the connecting pillar's second end is positioned above the resin layer, allowing it to supply the necessary solder for connection to the second substrate when melted.

Furthermore, it is desirable for the connecting pillar to have a solder layer with a first melting point at the first end, which connects to the first substrate, and a solder layer with a second melting point at the second end, which connects to the second substrate. In this case, the solder layer on the upper surface of the connecting pillar (the first solder layer) is composed of solder with the first melting point, while the solder layer on the lower surface (the second solder layer) is composed of solder with a higher melting point than the first solder. It is preferable for the melting point difference between the first and second solder to be within the range of 5° C. to 25° C. In cases where the temperature difference is less than 5° C., there is a possibility that the second solder could also melt when the first solder melts. On the other hand, if the temperature difference exceeds 25° C., there may be issues with incomplete melting.

The first solder's melting point is preferably between 210 and 220° C., while the second solder's melting point is preferably between 225 and 235° C.

<The Fifth Aspect> Dual-Solder Layer

Figure 7:
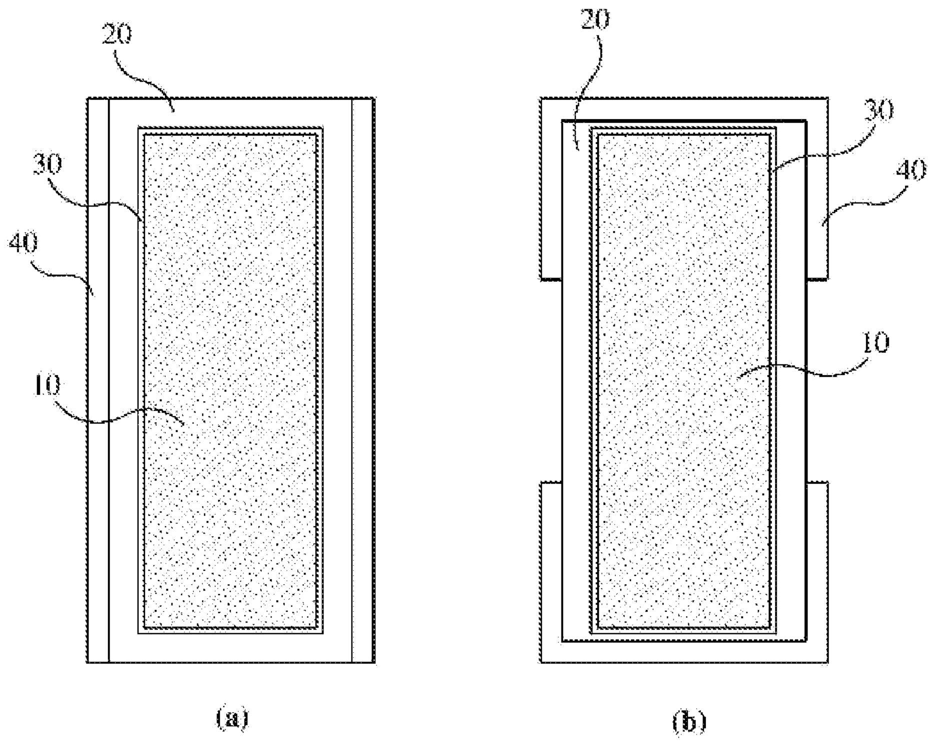
FIG. 7 is cross-sectional view of a dual-solder layer for connection.

In the third aspect, it was indicated that the solder layer of the pillars, when melted, does not achieve a uniform shape but rather melts in a random form. This leads to the problem of varying heights among the connecting pillars. Furthermore, when applying heat to attach the second end of the connecting pillar to the second substrate, there is a potential issue where the first end and the first substrate may also melt, resulting in the collapse of the connecting pillar. Regarding this issue, as an alternative solution, the fifth aspect of the present invention provides a connecting pillar with a dual-solder layer. Additionally, as described in the fourth aspect, using a resin layer can also be considered as another alternative solution. FIG. 7 is cross-sectional view of a dual-solder layer for connection.

Accordingly, the solder layer is formed by an inner the first solder layer and an outer second solder layer. The first solder layer is composed of solder with a first melting point, while the second solder layer is composed of solder with a second melting point. It is desirable that the temperature difference between the first melting point (T1) and the second melting point (T2) satisfies the condition of 5° C.<T2−T1<25° C. In cases where the temperature difference is less than 5° C., there is a possibility that the second solder may also melt along with the first solder when the first solder melts. Conversely, when the temperature difference exceeds 25° C., there may be issues with incomplete melting.

It is desirable to use Sn—Ag—Cu for the first solder layer as it provides good adhesion to the metal pillar before reflowing and ensures connection reliability after reflowing. The first solder layer may consist of silver (Ag), copper (Cu), and residual tin (Sn), as well as other unavoidable impurities to ensure connection reliability. The first solder layer should have a melting point range of 210° C. to 220° C.

More specifically, it provides a solder alloy consisting of 1.2 to 4.0 wt. % silver (Ag), 0.2 to 1.0 wt. % copper (Cu), residual tin (Sn), and other unavoidable impurities.

The second solder layer, which is desirable to use tin (Sn), can be composed of tin (Sn) along with other unavoidable impurities. The second solder layer's second melting point is preferably between 225° C. and 235° C.

More specifically, it provides a solder alloy composed of 100% by weight of tin (Sn) along with other unavoidable impurities.

The desirable thickness ratio (t2/t1) between the first solder layer and the second solder layer is 0.1<t2/t1<0.5. If the ratio is below 0.1, the amount of second solder layer melting is insufficient, making it difficult for the connecting pillar to securely attach to the substrate. On the other hand, if the ratio exceeds 0.5, the excessive melting of the second solder layer can cause the connecting pillar to tilt.

When utilizing the connecting pillar manufactured in this way on a substrate, it can provide the benefits of high drop strength, excellent thermal cycling (TC) characteristics, and wettability, as well as a low missing rate. By forming the inner layer with the first solder layer having the first melting point and the outer layer with the second solder layer having the second melting point, it is possible to apply a temperature higher than T1 and lower than T2 during the connection of the first substrate and the connecting pillar, allowing only the solder of the first solder layer inside the connecting pillar to melt without melting the second solder layer. Therefore, when the inner first solder layer melts, the connecting pillar can be positioned on the first substrate. At this stage, the bond is temporary since the amount of the first solder layer is small, and the outer second solder layer has not melted yet. As a result, the connecting pillar remains stable without tilting, or if there is any slight tilting, it is minimal.

After positioning the connecting pillar on the first substrate, a higher temperature than T2 is applied to melt the second solder layer to fully connect the electrodes of the first substrate and the connecting pillar that were temporarily joined, thereby establishing a complete connection between them. And then, electrically connected a connection between the second substrate and the connecting pillar.

Therefore, by equippillarg the connecting pillar with different solder layers, it becomes possible to securely connect the connecting pillar to the first substrate and second substrate without the need for a process involving the resin composition used in the fourth aspect.

EMBODIMENTS

<Embodiment 1>: Manufacturing of Copper Alloy Pillar

A copper alloy wire prepared by mixing Sn at a concentration of 5.0% in a molten copper was prepared. Next, the copper alloy wires were passed through a die to elongate them to a diameter of φ110 μm on both the top and bottom surfaces. Then, at a length (height L) of 490 μm, the copper alloy wires were cut to produce the desired copper alloy pillars. The cutting process was performed using a die-cutting method.

Afterward, the copper alloy pillars were annealed using the following annealing conditions: heating from room temperature to 200° C. for 20 minutes, maintaining at 200° C. for 180 minutes, and then cooling from 200° C. to room temperature for 20 minutes. The cooling process inside the furnace was carried out using a cooling fan installed in the furnace.

Embodiment 2 to 5

The copper alloy pillars were manufactured using the same method as Embodiment 1, and the additive element amounts for alloy composition and annealing temperatures are summarized in Table 1 below.

TABLE 1

| | Additive Elements and Contents (%) | Annealing Temperature (° C.) |
|---|---|---|
| Embodiment 1 | Sn 2.0% | 200 |
| Embodiment 2 | Sn 5.0% | 200 |

TABLE 1-continued

| | Additive Elements and Contents (%) | Annealing Temperature (° C.) |
|---|---|---|
| Embodiment 3 | Sn 7.0%, Zn 0.7% | 200 |
| Embodiment 4 | Sn 8.0% | 200 |
| Embodiment 5 | Sn 10.0% | 200 |

Comparative Example 1 to 3

Using the same method as Embodiment 1, copper alloy pillars were manufactured with the additive element contents and annealing temperatures summarized in Table 2.

TABLE 2

| | Additive Elements and Contents (%) | Annealing Temperature (° C.) |
|---|---|---|
| Comparative example 1 | No Sn | 320 |
| Comparative example 2 | Sn 0.05% | 350 |
| Comparative example 3 | Sn 25% | 380 |

Embodiment 6 to 10

The entire surface of the copper alloy pillars manufactured using Embodiment 1, where the solder layer was formed, was coated with a solder layer composed of Sn—Ag—Cu. First, the copper alloy pillars were acid washed, and then they were placed in a barrel with nickel applied to the anode. The plating solution, which comprised nickel sulfamate plating solution and additives, was added to the barrel. The copper alloy pillars were connected to the cathode and subjected to electroplating. The temperature was maintained at 55~65° C. Electroplating was carried out for 2 hours at a current density of 0.1 A/dm to form a diffusion layer with a thickness of approximately 2.1 μm.

Next, the copper alloy pillar with a diffusion layer is placed in the barrel, with Sn—Ag applied to the anode. After adding the MS-Cu plating solution and additives to the plating solution, the cathode is attached to the copper alloy pillar for electroplating. The temperature was maintained at 20~30° C.

The connecting pillar is manufactured by conducting electroplating at a current density of 1 A/dm for 3 hours, resulting in the formation of a first solder layer with a thickness of approximately 4 μm. The first solder layer is formed through the adjustment of Ag and Cu concentrations, and their respective compositions are listed in Table 3.

TABLE 3

| | Composition |
|---|---|
| Embodiment 6 | Sn1.5Ag0.2Cu |
| Embodiment 7 | Sn2.0Ag0.2Cu0.3Zn |
| Embodiment 8 | Sn3.0Ag0.2Cu |
| Embodiment 9 | Sn1.5Ag0.8Cu |
| Embodiment 10 | Sn3.0Ag0.8Cu |

<Embodiment 6-1 to 10-1>: Formation of Solder Layer

The entire surface of the copper alloy pillar, manufactured according to Embodiment 1, was coated with a solder layer composed of Sn—Ag—Cu. First, the copper alloy pillar is acid washed, and then it is placed in the barrel. Sn—Ag is applied to the anode, and the plating solution containing MS-Cu plating solution and additives is added. The cathode is attached to the copper alloy pillar for electroplating. The temperature was maintained at 20~30° C.

The connecting pillar is manufactured by conducting electroplating at a current density of 1 A/dm for 3 hours, resulting in the formation of a first solder layer with a thickness of approximately 6 μm. The first solder layer is formed with the composition as shown in Table 4.

Embodiments 6-1 to 10-1 were manufactured using connecting pillars without forming a diffusion layer.

TABLE 4

| | Composition |
|---|---|
| Embodiment 6-1 | Sn1.5Ag0.2Cu |
| Embodiment 7-1 | Sn2.0Ag0.2Cu0.3Zn |
| Embodiment 8-1 | Sn3.0Ag0.2Cu |
| Embodiment 9-1 | Sn1.5Ag0.8Cu |
| Embodiment 10-1 | Sn3.0Ag0.8Cu |

<Comparative Example 4 to 5>: The Copper Alloy Pillar Manufactured Using Embodiment 1

The entire surface was coated with a solder layer composed of Sn—Bi. The plating solution used for plating was a solution of methane sulfonic acid. The solder layer was formed through electroplating method with adjustment of Ag and Bi concentrations, and their compositions are summarized in Table 5.

TABLE 5

| | Composition |
|---|---|
| Comparative example 4 | Sn3.0Bi |
| Comparative example 5 | Sn3.0Bi1.0Ag |

<Embodiment 11 to Embodiment 15>: Formation of Dual-Solder Layer

In Embodiments 6 to 10, a second solder layer composed of Sn was formed on the surface of the first solder layer, which was formed on the entire surface of the copper alloy pillar. The copper alloy pillar with the first solder layer is placed in the barrel, with Sn—Ag applied to the anode, and the cathode is attached to the copper alloy pillar for electroplating. The temperature is maintained at 20-30° C. during the process.

The copper alloy pillar is manufactured by conducting electroplating at a current density of 1 A/dm for 3 hours, resulting in the formation of a second solder layer with a thickness of approximately 5 μm.

The plating solution used for plating was a solution of methane sulfonic acid. The first solder layer was formed through electroplating method with adjustment of Ag and Cu concentrations, and the second solder layer was formed by electroplating method to create a Sn plating layer. Their compositions are summarized in Table 6.

TABLE 6

| | Composition of the first solder layer | Composition of the second solder layer |
|---|---|---|
| Embodiment 11 | Sn1.5Ag0.2Cu | 100Sn |
| Embodiment 12 | Sn2.0Ag0.2Cu | 100Sn |
| Embodiment 13 | Sn3.0Ag0.2Cu | 100Sn |
| Embodiment 14 | Sn1.5Ag0.8Cu | 100Sn |
| Embodiment 15 | Sn3.0Ag0.8Cu | 100Sn |

Experimental Example

Figure 8:
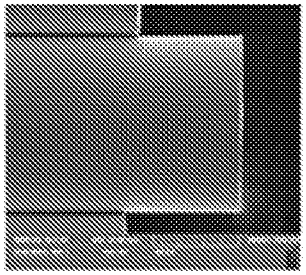
FIG. 8 is Fe-SEM images of occurrence of burrs on metal pillars according to embodiments and comparative examples.
Figure 8:
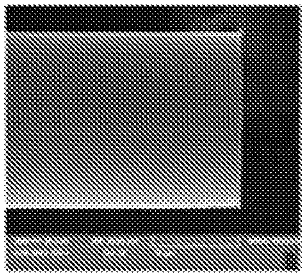
Figure 8:
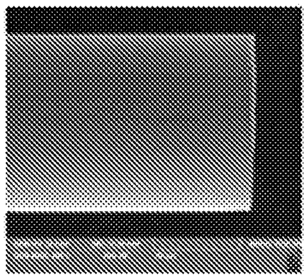
Figure 8:
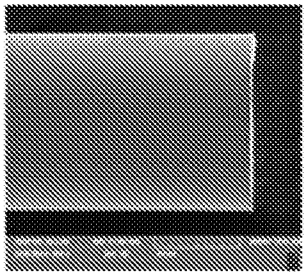
Figure 8:
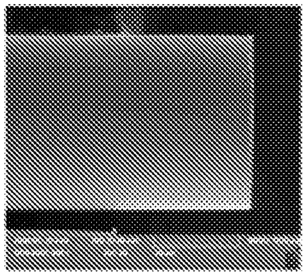
Figure 8:
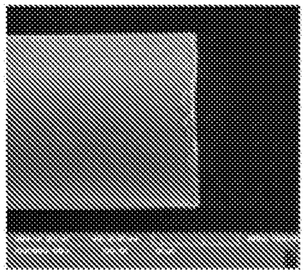
Figure 8:
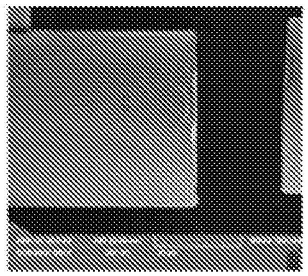
Figure 8:
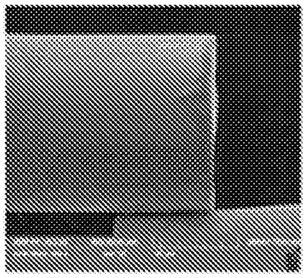

<Experimental Example 1>: Measurement of the Burr Generation of the Copper Alloy Pillar FIG. 8 is Fe-SEM images of occurrence of burrs on metal pillars according to embodiments and comparative examples. Accordingly, it can be observed that in Embodiments 1 to 5, where the content of Sn ranges from 0.1 wt. % to 20 wt. % and the annealing temperature ranges from 160 to 300, no burrs are formed when the metal pillar is cut. However, in the comparative examples, it is evident that significant and numerous burrs are formed.

<Experimental Example 2>: The Vickers Hardness and Electrical Conductivity of the Copper Alloy Pillar (Affected by Composition and Heat Treatment Temperature)

The experimental results of Vickers hardness and electrical conductivity for Embodiments 1 to 5 and Comparative Examples 1 to 3 are summarized in Table 7.

TABLE 7

| | Vickers hardness (HV) | Electrical conductivity (% IACS) |
|---|---|---|
| Embodiment 1 | 302 | 15 |
| Embodiment 2 | 288 | 13 |
| Embodiment 3 | 261 | 12 |
| Embodiment 4 | 246 | 9 |
| Embodiment 5 | 218 | 8 |
| Comparative example 1 | 369 | 101 |
| Comparative example 2 | 352 | 86 |
| Comparative example 3 | 190 | 28 |

<Experimental Example 3>: Shear Strength Testing for the Connecting Pillar

The connecting pillars manufactured by Embodiments 6 to 10 of the present invention were attached to the substrate, and the shear strength was measured and summarized in Table 8.

The PCB substrate used was a substrate with OSP treatment on the copper surface, and the copper surface size of the substrate was φ220 μm. The joining method involved printing flux or solder paste on the substrate, followed by reflow oven processing, maintaining a peak temperature of 250° C. for 50 seconds for the bonding process.

TABLE 8

| | Shear stress(gf) |
|---|---|
| Embodiment 6 | 171 |
| Embodiment 7 | 178 |
| Embodiment 8 | 189 |
| Embodiment 9 | 180 |
| Embodiment 10 | 192 |
| Embodiment 6-1 | 166 |
| Embodiment 7-1 | 168 |
| Embodiment 8-1 | 170 |
| Embodiment 9-1 | 169 |
| Embodiment 10-1 | 172 |
| Embodiment 11 | 158 |
| Embodiment 12 | 159 |
| Embodiment 13 | 180 |
| Embodiment 14 | 162 |
| Embodiment 15 | 179 |

<Experimental Example 4>: Drop Impact Test

The drop impact strength test was conducted according to the JESD22-B111 standard to measure the specimen's drop impact resistance. Specifically, the copper-surface-treated printed circuit substrate with the connecting pillars attached was subjected to a gravitational acceleration of 1500 G and an impact duration of 0.5 msec. The drop impact strength was measured based on the number of drops that resulted in 5% and 63.2% destruction of the solder.

The failure of the specimen was defined as a destruction occurring when the resistance increased by 10% or more from the initial resistance. In the evaluation of five consecutive drops, if the drop impact resistance value increased by 10% or more from the initial resistance in three out of the five drops, it was considered as failure. The test results are summarized in Table 9.

TABLE 9

| | 5% destruction by drop test (Number of drops) | 63.2% destruction by drop test (Number of drops) |
|---|---|---|
| Embodiment 6 | 18.669 | 108.657 |
| Embodiment 7 | 22.002 | 121.312 |
| Embodiment 8 | 26.038 | 152.897 |
| Embodiment 9 | 17.778 | 112.984 |
| Embodiment 10 | 24.284 | 154.687 |
| Embodiment 6-1 | 17.862 | 105.823 |
| Embodiment 7-1 | 20.107 | 116.811 |
| Embodiment 8-1 | 23.915 | 142.987 |
| Embodiment 9-1 | 17.184 | 108.198 |
| Embodiment 10-1 | 20.224 | 148.911 |
| Embodiment 11 | 19.081 | 119.156 |
| Embodiment 12 | 22.111 | 158.248 |
| Embodiment 13 | 26.088 | 161.194 |
| Embodiment 14 | 18.902 | 128.261 |
| Embodiment 15 | 26.126 | 169.445 |

<Experimental Example 5>: Thermal Cycle Test

The thermal cycling characteristics of the specimens were measured according to the JEDS22-A104-B standard, with testing conducted under conditions of −40° C. to 125° C. Each cycle consisted of maintaining the temperature at 125° C. for 10 minutes, followed by a transition to −40° C. and maintaining it for another 10 minutes. The number of cycles resulting in 5% and 63.2% failures were measured.

The criterion for specimen failure was based on measuring the resistance after every 100 completed cycles. If the resistance indicated an electrical short, the specimen was excluded from further testing.

Table 10 presents the results of the thermal cycling test for the connecting pillars. It can be observed that the comprising of Ni and Pd leads to a thermal cycling lifespan that is up to twice as long as when they are not comprised. The optimal cycle count was achieved with Ni and Pd contents of 0.05 wt. % and 0.03 wt. %, respectively, which correspond to the solder ball composition in Embodiment 5.

TABLE 10

| | 5% destruction by thermal test (number of cycles) | 63.2% destruction by thermal test (number of cycles) |
|---|---|---|
| Embodiment 6 | 480.121 | 809.781 |
| Embodiment 7 | 395.189 | 682.144 |
| Embodiment 8 | 334.891 | 759.872 |
| Embodiment 9 | 462.529 | 801.871 |
| Embodiment 10 | 316.818 | 598.745 |
| Embodiment 6-1 | 468.524 | 800.591 |
| Embodiment 7-1 | 390.791 | 671.833 |
| Embodiment 8-1 | 330.291 | 748.159 |
| Embodiment 9-1 | 454.767 | 793.953 |
| Embodiment 10-1 | 310.890 | 589.898 |
| Embodiment 11 | 423.841 | 761.418 |
| Embodiment 12 | 384.619 | 700.847 |
| Embodiment 13 | 349.726 | 658.418 |
| Embodiment 14 | 422.168 | 711.691 |
| Embodiment 15 | 327.189 | 621.482 |

While the above description contains specific details, they should be interpreted as examples of embodiments rather than limitations defining the scope of the invention. Therefore, the scope of the present invention should be determined not by the described embodiments, but by the technical principles set forth in the claims of the patent.

Figure 9:
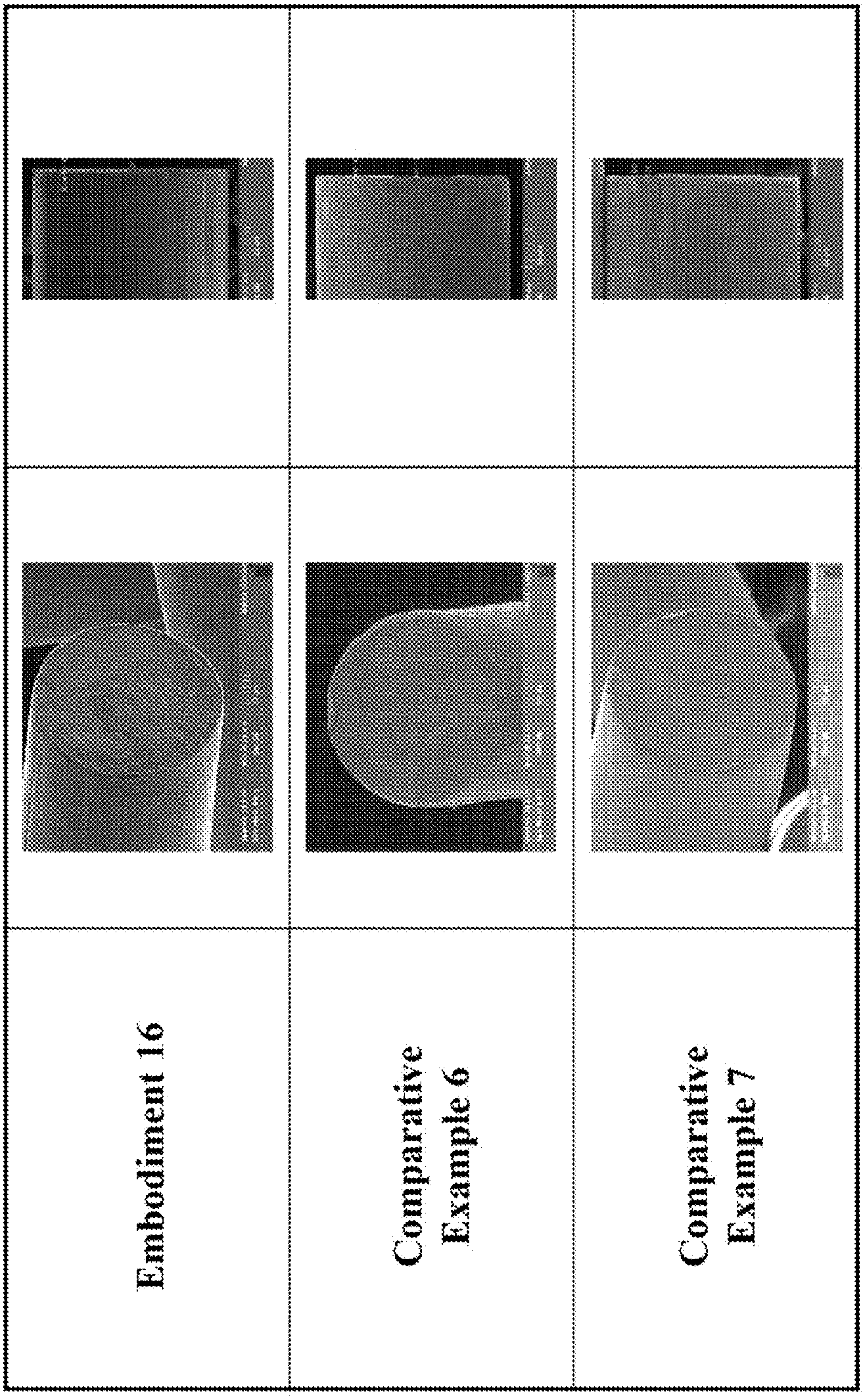
FIG. 9 shows electron micrographs of metal pillars made from different alloy compositions.

<Experimental Example 6>: Electron Micrographs of Cut Surfaces Depending on the Composition of the Metal Pillars Copper alloy pillars were prepared in the same manner as in Embodiment 1, but Embodiment and Comparison Examples with various alloy compositions corresponding to Table 1 were prepared, tensile strength was measured, and electron micrographs were taken, as shown in FIG. 9. Accordingly, it can be seen that the burrs and defects of the embodiments are significantly reduced.

TABLE 11

| | Cu | Pb | Fe | Sn | Zn | P | Diameter | Tensile Strength |
|---|---|---|---|---|---|---|---|---|
| embodiment 16 | Residual | 0.02 or less | 0.10 or less | 5.5~7.0 | 0.20 or less | 0.03~0.35 | 0.40~5.0 | 835 or above |
| Comparative example 6 | Residual | 0.02 or less | 0.10 or less | Sn 3.0~5.5% | 0.20 or less | 0.03~0.35 | 0.40~5.0 | 862 or above |
| Comparative example 7 | Residual | 0.02 or less | 0.10 or less | Sn 7.0~9.0% | 0.20 or less | 0.03~0.35 | 0.40~5.0 | 930 or above |

Although many specific details are provided in this description, they should be interpreted as examples of embodiments and not as limiting the scope of the invention. Accordingly, the scope of the invention should be determined by the documented technical features based on the scope of the patent claims, not by the described embodiments.

What is claimed is:

1. A metal pillar for electrically connecting an electrode or a pad of a substrate to an electrode or a pad of a semiconductor chip in a semiconductor package, formed into a column-shaped metal pillar of a certain length by cutting a metal wire, wherein the metal pillar has a burr length of 0.1 to 0.5 μm on a cut surface of the metal pillar, an electrical conductivity of 11 to 101% IACS, and a thermal conductivity of 50 to 450 W/mK.

2. The metal pillar for conductive connection of claim 1, wherein diameter of the metal pillar is 50 to 300 μm and the height of the metal pillar is 60 to 300 μm.

3. The metal pillar for conductive connection of claim 2, wherein aspect ratio (height/diameter) of the metal pillar is 1.2 to 5.

4. The metal pillar for conductive connection of claim 3, wherein melting point of the metal pillar is 500 to 1000° C.

5. The metal pillar for conductive connection of claim 4, wherein tensile strength of the metal pillar is 170 to 950 MPa.

6. The metal pillar for conductive connection of claim 4, wherein the metal pillar is mainly composed of one metal selected from the group consisting of Cu, Ag, Au, Pt, and Pd.

7. The metal pillar for conductive connection of claim 6, wherein the metal pillar is composed of one metal selected from the group consisting of Sn, Fe, Zn, Mn, Ni, and P, and contains any of the selected metal in a range of 0.1 wt. % to 20 wt. %.

8. The metal pillar of claim 1, wherein the metal pillar has a Vickers hardness of 150 to 300 HV.

* * * * *